(12) United States Patent
Heikkilä

(10) Patent No.: US 8,483,981 B2
(45) Date of Patent: *Jul. 9, 2013

(54) INDUCTION MOTOR PARAMETER IDENTIFICATION

(75) Inventor: Samuli Heikkilä, Helsinki (FI)

(73) Assignee: ABB Oy, Helsinki (FI)

( * ) Notice: Subject to any disclaimer, the term of this patent is extended or adjusted under 35 U.S.C. 154(b) by 433 days.

This patent is subject to a terminal disclaimer.

(21) Appl. No.: 12/830,827

(22) Filed: Jul. 6, 2010

(65) Prior Publication Data

US 2011/0010116 A1   Jan. 13, 2011

(30) Foreign Application Priority Data

Jul. 3, 2009   (EP) ................................ 09164537

(51) Int. Cl.
   *G01R 15/00*   (2006.01)
(52) U.S. Cl.
   USPC .............................. 702/57; 702/117; 702/189
(58) Field of Classification Search
   USPC .............. 702/57, 117, 189; 363/176; 322/47; 318/727, 801, 809, 812; 324/765.01
   See application file for complete search history.

(56) References Cited

U.S. PATENT DOCUMENTS

| | | | |
|---|---|---|---|
| 4,791,340 A * | 12/1988 | Finney | 318/809 |
| 5,594,670 A | 1/1997 | Yamamoto | |
| 5,942,876 A * | 8/1999 | Maekawa | 318/801 |
| 2006/0273755 A1 | 12/2006 | Heikkila | |
| 2011/0001447 A1 * | 1/2011 | Heikkila | 318/490 |

FOREIGN PATENT DOCUMENTS

| | | |
|---|---|---|
| DE | 10254940 A1 | 6/2004 |
| EP | 1729141 A1 | 12/2006 |
| JP | 62-42076 A | 2/1987 |
| KR | 20040084083 A | 10/2004 |
| WO | WO 03/047084 A1 | 6/2003 |

OTHER PUBLICATIONS

Globevnik, Induction Motor Parameters Measurement at Stand Still, 1998, IEEE Publicaiton, pp. 280-285.*
Moon et al., 'Estimation of Induction Machine Parameters from Standstill Time Domain Data', 1993, IEEE Publicaiton, pp. 336-342.*
European Search Report for EP 09164537.4 dated Sep. 9, 2009.

* cited by examiner

*Primary Examiner* — Elias Desta
(74) *Attorney, Agent, or Firm* — Buchanan Ingersoll & Rooney PC

(57) ABSTRACT

A method and an arrangement are provided for identifying parameters of an induction machine when the induction machine is connected to the output phases of a voltage source inverter and the induction machine is in standstill state. The method includes providing a DC magnetization current ($i_{dc\_magn}$) to the induction machine with the inverter, controlling the power semiconductors of the inverter to an off-state, controlling all the output phases of the inverter to the same potential to provide a zero voltage vector, measuring the stator current ($i_{sd}$) during the zero voltage vector, and determining parameters of the induction machine from the stator current ($i_{sd}$) measured during the zero voltage vector.

19 Claims, 6 Drawing Sheets

INDUCTION MOTOR PARAMETER IDENTIFICATION

RELATED APPLICATIONS

This application claims priority under 35 U.S.C. §119 to European Patent Application No. 09164537.4 filed in Europe on Jul. 3, 2009, the entire content of which is hereby incorporated by reference in its entirety.

FIELD

The present disclosure relates to a method of identifying motor parameters, and more particularly to a method with which parameters of an induction motor can be identified without rotating the motor. The present disclosure also relates to an arrangement for identifying parameters of an induction motor, and more particularly to an arrangement for identifying parameters of an induction motor when the induction motor is in a standstill state.

BACKGROUND INFORMATION

When a frequency converter or a similar device is used for controlling the motion of a motor, it is desirable for the motor parameters be known. The machine parameters are used in control algorithms of the converter for accurate control of the load. The parameters of the machine can be identified using an identification procedure during the commissioning of the drive. In this identification run the converter performs one or more tests on the machine and estimates the parameters to be used for control.

In some situations, the load connected to the machine causes some restrictions to the drive so that the identification procedure cannot be carried out. The load connected to the controlled motor produces counter torque, which disturbs the identification run to the extent that the identification procedure does not provide accurate results that would enable precise control of the motor. It might also be possible that the identification run cannot be performed with the load at all due to maximum speed and/or maximum torque limits set for the load. In these situations, the identification run would involve completely taken off the controlled machine from the load. This is often cumbersome and sometimes even impossible if the machine to be controlled is an integral part of the mechanics of the load.

For these purposes, frequency converters may have an option for a stand-still identification procedure in which the rotor of the machine is not rotated. However, the stand-still procedures are able to identify only some of the parameters of the motor while other parameters are calculated using rated values of the machine.

FIG. 1 shows an L-equivalent circuit of an induction machine. The stator resistance $R_s$ of the equivalent circuit can be quite easily identified using DC magnetization current, i.e. stator current $i_s$, produced with a constant stator voltage $u_s$. Rotor resistance $R_R$ and stray inductance $\sigma L_s$ can be identified using a DC current with summed pulsed current or with some other injected current.

A disadvantage of the known stand-still identification methods is that the measurement of main inductance $L_M$ and the rotor time constant $\tau_r (= L_M/R_R)$ depending thereon is very tricky because the machine cannot be rotated. This is due to the fact that in stand-still methods, the used stator current pulses are almost entirely summed with opposing phases to the rotor current. This means that the corresponding changes in the magnetizing current $i_m$ are relatively small, and thus the response from the main inductance to the test pulses is poor.

The known stand-still methods cannot achieve satisfying estimates for the main inductance and rotor time constant, and these parameters are usually approximated from slip frequency and power factor calculated from the rated values of the machine or from the cos θ value given as the rated value. On the other hand, the rated values are not necessarily exact so that the values obtained for the main inductance and rotor time constant with the known stand-still identification methods are inaccurate, which is reflected as a poorer performance of the control when compared to the performance achieved with parameters obtained in identification runs performed with rotating machines.

The accuracy of the voltage measurement should increase considerably so that sufficiently accurate estimates for the main inductance $L_M$ or rotor time constant $\tau_r$ could be calculated in stand-still methods. The increase in voltage accuracy is hard to achieve since, due to reduced costs, the output voltage in frequency converters is typically calculated using a measured DC bus voltage and output switch combination. In this kind of measurement, commutation delays and threshold voltages cause inaccuracies to the voltage measurement. These inaccuracies can be quite considerable when compared with the voltage response from the main inductance at the injection frequency.

SUMMARY

An exemplary embodiment provides a method of identifying parameters of an induction machine when the induction machine is connected to the output phases of a voltage source inverter and the induction machine is in standstill state. The exemplary method comprises providing a DC magnetization current ($i_{dc\_magn}$) to the induction machine with the inverter, controlling power semiconductors of the inverter to an off-state, controlling all output phases of the inverter to the same potential to provide a zero voltage vector, measuring a stator current ($i_{sd}$) during the zero voltage vector, and determining, in a processing device, parameters of the induction machine from the stator current ($i_{sd}$) measured during the zero voltage vector.

An exemplary embodiment provides an arrangement for identifying parameters of an induction machine when the induction machine is connected to the output phases of a voltage source inverter and the induction machine is in standstill state. The inverter is configured to provide DC magnetization to the induction machine. The arrangement comprises means for controlling the power semiconductors of the inverter to an off-state, and means for controlling all output phases of the inverter to the same potential to provide a zero voltage vector. The arrangement also comprises means for measuring the stator current during the zero voltage vector, and means for determining parameters of the induction machine from the stator current measured during the zero voltage vector.

BRIEF DESCRIPTION OF THE DRAWINGS

Additional refinements, advantages and features of the present disclosure are described in more detail below with reference to exemplary embodiments illustrated in the drawings, in which.

DETAILED DESCRIPTION

Figure 1:
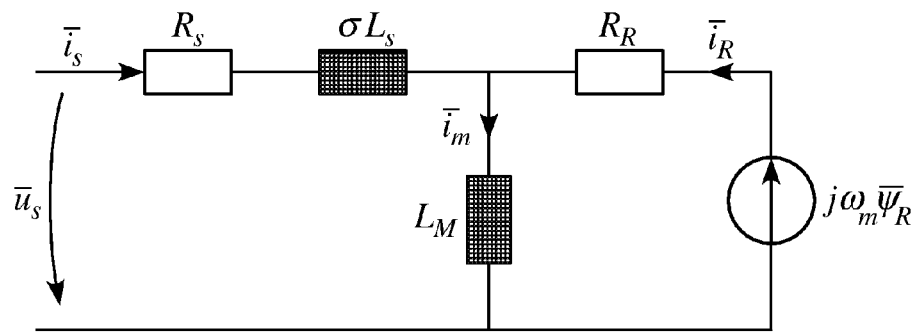
FIG. 1 shows an equivalent circuit of an induction machine.

Exemplary embodiments of the present disclosure provide a method and an arrangement for implementing the method of identifying motor parameters.

Exemplary embodiments of the present disclosure are based on the idea of indirect measurement of decaying counter voltage of an induction machine. With the method and apparatus of the disclosure, the parameters required for control of an induction machine can be identified without rotating the machine.

The method and apparatus of the present disclosure can eliminate the above disadvantages relating to inaccuracies of estimated main inductance and rotor time constant without needing to increase the accuracy of voltage measurement. The present disclosure provides a way to determine directly the rotor time constant, after which the main inductance can also be estimated if the rotor resistance is known. An exemplary embodiment of the present disclosure also provides a method for determining the rotor resistance. Further, an exemplary embodiment of the present disclosure also provides a method for calculating the threshold voltages more accurately than before.

In the following description, the method of the disclosure is first used to determine the rotor time constant, and then a description is given on how to estimate rotor resistance and threshold voltages. In further sections of the description, the disclosure is used in connection with determining the rotor time constant independently of the other parameters of the induction machine, and finally a description is given on the calculation of the main inductance from the results obtained with the method of the disclosure. The description also includes an example of a control system of a frequency converter for carrying out the method of the disclosure.

Rotor Time Constant

The present disclosure is based on indirectly measuring the decaying counter voltage of an induction machine (e.g., an induction motor) when the power stage of a frequency converter is made inactive, i.e. the power switches are controlled to an off-state when the machine is magnetized. The magnetization of the machine has been carried out so long that the flux of the machine is in steady state before passivating the power stage of the inverter or frequency converter. According to an exemplary embodiment of the disclosure, DC magnetization is provided to the induction machine with the inverter, and the power semiconductors of the inverter are controlled to an off-state.

Immediately after the power stage has been passivated, the stator current commutates for a short period of time to the free-wheeling diodes connected in anti-parallel with the controlled switches. The current vector is quickly reduced to zero since there is a voltage in the machine terminals, which equals the used DC voltage and has an opposing polarity with respect to the stator current as long as the diodes carry the current. The decaying of the current to zero can last from 200 to 300 µs, and the rotor flux does not fall considerably during that period.

When the current reaches zero, the magnitude of the rotor flux is:

$$\psi_R = L_M i_{dc\_magn} = R_R \tau_r i_{dc\_magn} \qquad (1)$$

where $i_{dc\_magn}$ is the magnetizing current fed to the machine before passivating the power stage.

Let us assume that after the passivating at time instant $t=t_0$, the current has dropped to zero. After that time instant, the rotor flux of the machine decays with a time constant $\tau_r$ according to the exponent law:

$$\psi_R(t) = \psi_R e^{-(t-t_0)/\tau_r} = L_M i_{dc\_magn} e^{-(t-t_0)/\tau_r} = R_R \tau_r i_{dc\_magn} e^{-(t-t_0)/\tau_r} \qquad (2)$$

The decaying of the rotor flux induces a voltage to the terminals of the machine, which can be calculated using dynamic state equation of the machine:

$$u_{sd} = (R_s + R_R)i_{sd} + \sigma L_s \frac{di_{sd}}{dI} - \frac{\psi_R}{\tau_r} \qquad (3)$$

in which $u_{sd}$ and $i_{sd}$ are the stator voltage and stator current components in the direction of both rotor flux and magnetizing current, respectively.

The current and the derivative of the current are zero, according to (3):

$$u_{sd} = -\frac{\psi_R}{\tau_r}. \qquad (4)$$

The instantaneous voltage in the machine terminals is thus directly proportional to the magnitude of the rotor flux. Thus, when the rotor flux decays, the stator voltage decays according to the same exponential law. By measuring the terminal voltage of the machine at two different time instants, it would basically be possible to determine the rotor time constant. The voltage of equation (4) is so low (for example, less than 10V) that such voltages cannot be measured in frequency converters without costly special arrangements.

In the present disclosure, this problem is solved by measuring the instant indirectly. According to exemplary embodiments of the present disclosure, all the output phases of the inverter are controlled to the same potential to provide a zero voltage vector. Thus, the power stage of the inverter is activated, and all output phases are controlled either to a positive or negative DC voltage of the intermediate circuit to produce a zero vector. Since the threshold voltages of the diodes and transistors of the power stage are smaller than the induction voltage (4), the stator current starts to flow when the terminal voltage of the machine is equal to the threshold voltage $u_{th}$ acting over the power semiconductor components $$u_{sd} = -u_{th} \qquad (5)$$

When the zero voltage vector is in use, current follows the equation:

$$-u_{th} = (R_s + R_R)i_{sd} + \sigma L_s \frac{di_{sd}}{dt} - \frac{\psi_R}{\tau_r}. \quad (6)$$

Figure 2:
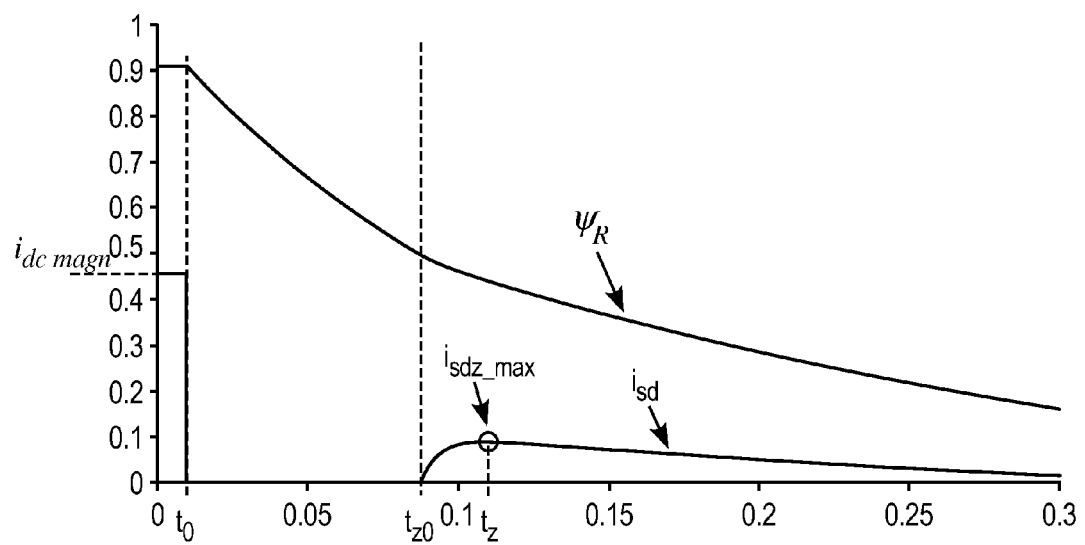
FIG. 2 shows stator current and rotor flux waveforms in accordance with an exemplary embodiment of the present disclosure.

As shown in FIG. 2, the current thus rises in the direction of the original magnetizing current with the time constant $\sigma L_s/(R_s+R_R)$, which is considerably smaller than the rotor time constant $\tau_r = L_M/R_R$. After a particular time, the current reaches its maximum value $i_{sdz\_max}$, after which it starts to drop again since the rotor flux is still decaying and forcing the derivate of the current finally to be negative in equation (6).

In FIG. 2, the current has its maximum value at time instant $t=t_z$, at which instant the derivate of the current is zero:

$$\left(\frac{di_{sd}}{dt}\right)_{t=t_z} = 0. \quad (7)$$

At the instant of the current maximum, the stray inductance term is eliminated from equation (6). Thus, at time instant $t_z$, equation (6) can be written as $$-u_{th} = (R_s + R_R)i_{sdz\_max} - \frac{\psi_R(t_z)}{\tau_r}. \quad (8)$$

The magnitude of the rotor flux at time instant $t_z$ depends on the maximum value of the current $i_{sdz\_max}$ and the rotor time constant in the following way:

$$\psi_R(t_z) = (u_{th}+(R_s+R_R)i_{sdz\_max})\tau_r. \quad (9)$$

If it is assumed that the increase of the stator current during the zero vector does not considerably slow down the decaying of the rotor flux before the time instant $t_z$, the exponential law of equation (2) should produce a value according to (9) for the rotor flux. In other words:

$$\psi_R(t_z) = R_R\tau_r i_{dc\_magn} e^{-(t_z-t_0)/\tau_r} = (u_{th}+(R_s+R_R)i_{sdz\_max}) \tau_r. \quad (10)$$

The rotor time constant can now be solved from equation (10) in the following way:

$$e^{-(t_z-t_0)/\tau_r} = \frac{u_{th} + (R_s + R_R)i_{sdz\_max}}{R_R i_{dc\_magn}} \quad (11)$$

$$\Rightarrow \tau_r = \frac{t_z - t_0}{\ln\left(\frac{R_R i_{dc\_magn}}{u_{th} + (R_s + R_R)i_{sdz\_max}}\right)}$$

The decaying of the rotor flux due to the increase of the stator current during time period $t_{z0} \ldots t_z$ and the resulting error in the estimate of equation (11) can be taken into account by using the exponential law during the activating of the zero vector (i.e. to $t_{z0}$) and by calculating then the change in the rotor flux from the stator current:

$$\psi_R(t_z) = R_R \tau_r i_{dc\_magn} e^{-(t_z-t_0)/\tau_r} + \frac{1}{\tau_r}\int_{t_{z0}}^{t_z}(L_M i_{sd}(t) - \psi_R(t))dt \quad (12)$$

$$= R_R\tau_r i_{dc\_magn} e^{-(t_z-t_0)/\tau_r} + \int_{t_{z0}}^{t_z}\left(R_R i_{sd}(t) - \frac{\psi_R(t)}{\tau_r}\right)dt$$

The magnitude of the voltage component $\psi_R/\tau_r$ in the integral can be approximated as a constant during period $t_{z0} \ldots t_z$.

This magnitude can be solved from equation (8) at the time instant $t_z$, which is the time instant of the maximum current:

$$\frac{\psi_R(t)}{\tau_r} \approx \frac{\psi_R(t_z)}{\tau_r} = u_{th} + (R_s + R_R)i_{sdz\_max} \quad (13)$$

By inserting equation (13) into the integral expression of equation (12), the rotor flux according to the exponential law can be extrapolated to the time instant $t_z$ in the following way:

$$\psi_R(t_z) = R_R\tau_r i_{dc\_magn} e^{-t_{z0}/\tau_r} + \quad (14)$$
$$R_R \int_{t_{z0}}^{t_z} i_{sd}(t) dt - (u_{th} + (R_s + R_R)i_{sdz\_max})(t_z - t_{z0})$$

Based on equation (14), a rotor time constant should be calculated, which gives a rotor flux with the same magnitude as equation (9) at the time instant $t_z$, i.e.:

$$R_R \tau_r i_{dc\_magn} e^{-(t_z-t_0)/\tau_r} + \quad (15)$$
$$R_R \int_{t_{z0}}^{t_z} i_{sd}(t)dt - (u_{th} + (R_s+R_R)i_{sdz\_max})(t_z - t_{z0}) =$$
$$(u_{th}+(R_s+R_R)i_{sdz\_max})\tau_r \Leftrightarrow R_R\tau_r i_{dc\_magn} e^{-(t_{z0}-t_0)/\tau_r} =$$
$$(u_{th}+(R_s+R_R)i_{sdz\_max})(\tau_r + t_z - t_{z0}) - R_R\int_{t_{z0}}^{t_z} i_{sd}(t)dt \Rightarrow \tau_r =$$

$$\frac{t_{z0} - t_0}{\ln\left(\frac{R_R\tau_r i_{dc\_magn}}{(u_{th}+(R_s+R_R)i_{sdz\_max})(\tau_r + t_z - t_{z0}) - R_R\int_{t_{z0}}^{t_z} i_{sd}(t)dt}\right)}.$$

As shown, the more precise rotor time constant cannot be solved in the closed form from equation (15). It can, however, be solved numerically using a suitable iteration method. Another possibility is to use a calculated estimate of the rotor time constant on the right side of equation (15). The calculated estimate can be calculated, for example, from rated values of the machine. The use of a calculated estimate on the right side of the equation yields to a more accurate estimate than equation (11) even if the rated values are slightly incorrect.

The calculation of the rotor time constant from equations (11) or (15) requires that both stator and rotor resistances are known. Stator resistance can be measured quite accurately during DC magnetization, but the rotor resistance estimate may have considerable errors due to the used injected signal and its frequency. Errors may be caused especially by skin effect and inaccuracies in the voltage measurement and/or voltage control. Errors can also be due to inaccuracies in determining the time instant $t_z$ since the derivate of stator current is close to zero in the vicinity of $i_{sdz\_max}$.

Figure 3:
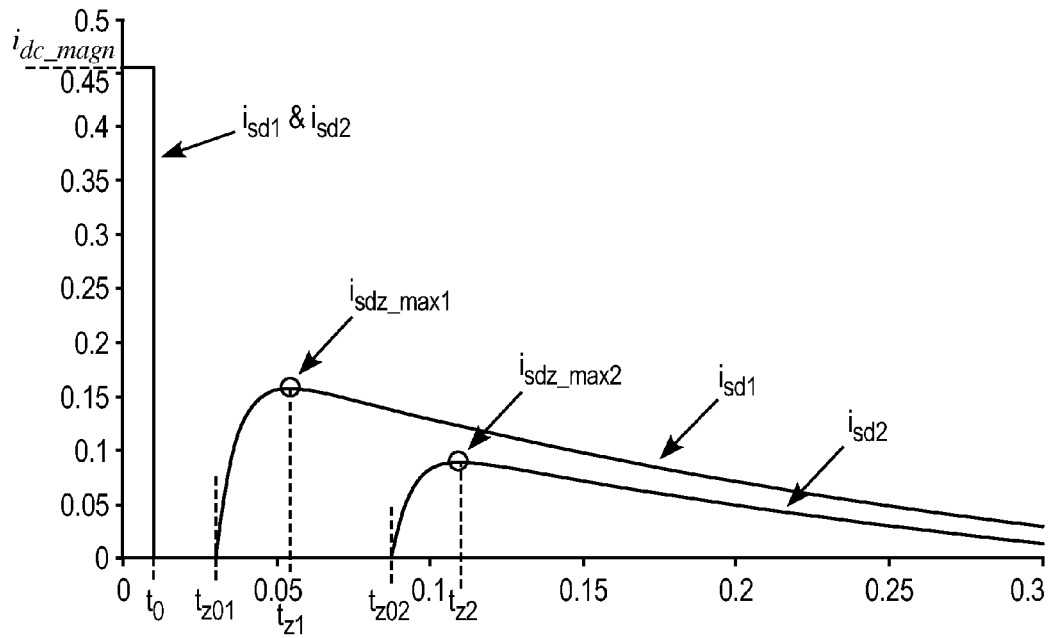
FIGS. 3, 4, 5 and 6 show stator current waveforms in accordance with exemplary embodiments of the present disclosure.

The sensitivity of estimates from equations (11) and (15) can be reduced by repeating the pulse test performed above with differing delays in using the zero vectors $t_{z01}$ and $t_{z02}$. This procedure is illustrated in FIG. 3. Thus, two different tests are carried out, in which the machine is first magnetized with current $i_{dc\_magn}$ and the pulses are passivated at the time instant $t_0$. In test 1, the zero vector is taken into use at the time instant $t_{z01}$, after which the stator current flows according to curve $i_{sd1}$ and reaches its maximum value $i_{sdz\_max1}$ at the time instant $t_{z1}$. In test 2, the zero vector is activated at a time instant which is after $t_{z01}$, i.e. at the time instant $t_{z02}$, after which the current flows according to curve $i_{sd2}$ and reaches the maximum $i_{sdz\_max2}$ at the time instant $t_{z2}$.

According to equation (9) the rotor fluxes at the time instants $t_{z1}$ and $t_{z2}$ are $$\begin{cases} \psi_R(t_{z1}) = (u_{th} + (R_s + R_R)i_{sdz\_max1})\tau_r \\ \psi_R(t_{z2}) = (u_{th} + (R_s + R_R)i_{sdz\_max2})\tau_r \end{cases} \quad (16)$$

If the zero vector was not switched on during time period $t_{z1} \ldots t_{z2}$, the rotor flux would decay, when the pulses are passivated, according to the exponential law of equation (10) such that:

$$\psi_R(t_{z2}) = \psi_R(t_{z1})e^{-(t_{z2}-t_{z1})/\tau_r} \quad (17)$$

The rotor time constant can now be solved by making the same approximations as in the case with the estimate of equation (11), assuming that the increase of stator current during the zero vector does not considerably slow down the decaying of the rotor flux prior to the time instants $t_{z1}$ and $t_{z2}$. In other words, the decaying of the rotor flux (17) according to the exponential law satisfies the system of equations (16), whereby $$(u_{th} + (R_s + R_R)i_{sdz\_max2})\tau_r = (u_{th} + (R_s + R_R)i_{sdz\_max1})\tau_r e^{-(t_{z2}-t_{z1})/\tau_r} \quad (18)$$

$$e^{-(t_{z2}-t_{z1})/\tau_r} = \frac{u_{th} + (R_s + R_R)i_{sdz\_max2}}{u_{th} + (R_s + R_R)i_{sdz\_max1}} \Rightarrow \tau_r = \frac{t_{z2} - t_{z1}}{\ln\left(\frac{u_{th} + (R_s + R_R)i_{sdz\_max1}}{u_{th} + (R_s + R_R)i_{sdz\_max2}}\right)}$$

By comparing equations (11) and (18), it is seen that the rotor time constant estimate calculated with equation (18) is considerably less dependent on the errors of the resistances than the estimate from equation (11). This sensitivity to errors in the resistance estimates decreases as the threshold voltage $u_{th}$ decreases. Further, in equation (18), the relative effect of the zero vector on the decaying of the rotor flux is approximately equal in magnitude in both of the rotor fluxes calculated according to the system of equations (16). This means that the mentioned effect is practically compensated in the quotient of the logarithmic function of equation (18). Thus, when the rotor time constant is calculated using two separate zero vector tests, the effect of the zero vector need not to be taken into account as in connection with equation (15).

Further, the inaccuracy of determining the time instant $t_z$ in the estimates from equations (11) and (15) can be avoided in the case of an estimate from equation (18). This is due to the rise times of the current ($t_{z1}-t_{z01}$ and $t_{z2}-t_{z02}$) being practically the same. Thus, the time difference $t_{z2}-t_{z1}$ in equation (18) can be replaced with the time difference $t_{z02}-t_{z01}$. Since the latter of the time differences is a precisely known estimate, $$\tau_r = \frac{t_{z02} - t_{z01}}{\ln\left(\frac{u_{th} + (R_s + R_R)i_{sdz\_max1}}{u_{th} + (R_s + R_R)i_{sdz\_max2}}\right)} \quad (19)$$

equation (19) can provide even more precise results than the estimate from equation (18).

Thus, according to exemplary embodiments of the present disclosure, stator current is measured during the zero voltage vector, and parameters of the induction machine are determined from the measured stator current.

In the above-described exemplary embodiment, the determined parameter is a rotor time constant, and the maximum current and its time instant are also determined during the zero vector for the calculations.

According to an exemplary embodiment of the disclosure, after the first test procedure, the induction machine is magnetized again, and the test procedure is repeated with a differing time period between the shut-down of the inverter and switching-on of the zero vector. The time difference between the time instants at which the currents reach their maximum is used for estimating the rotor time constant. In an exemplary embodiment of the present disclosure in which two separate tests are carried out, the time difference between the zero vector switching instants are used instead of the time difference between the highest current instants. As used herein, time differences between two separate measurements refers to time instants measured from the beginning of the respective tests and not to time elapsed between tests.

Rotor Resistance and Threshold Voltages

The rotor time constant was estimated in accordance with the above-described exemplary embodiment of the present disclosure. In the estimation, the used parameters included rotor resistance and threshold voltage. These parameters can be given for the estimation of the rotor time constant without using the present disclosure. However, the present disclosure provides a way to determine the rotor resistance $R_R$ and the threshold voltage $u_{th}$ more accurately than in previously known methods.

Figure 4:
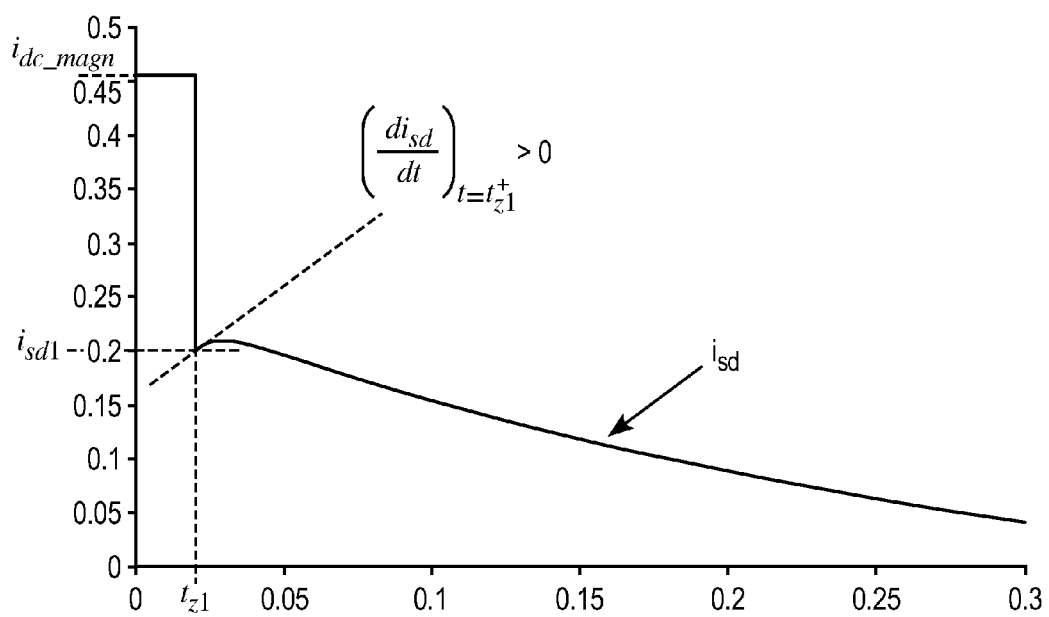

Assume that the machine has been magnetized with a current $i_{dc\_magn}$ until a steady state is obtained. After the magnetization, the pulses are taken away, i.e. the power stage is passivated for a while and a zero vector is switched on at a time instant $t_{z1}$, where the current has fallen to a value $i_{sd1}$, as seen in FIG. 4. Due to the zero vector, the collapsing of the stator current first stops and then the current decays slowly towards zero. In some cases, as shown in FIG. 4, for example, the current temporarily grows, forming a local maximum before it starts to decrease.

From equation (3), it follows that during the zero vector the derivative of the current is $$\frac{di_{sd}}{dt} = \frac{1}{\sigma L_s}\left(\frac{\psi_R}{\tau_r} - u_{th} - (R_s + R_R)i_{sd}\right) \quad (20)$$

An objective is to find a limit value $i_{sd0}$ for the stator current and a corresponding switching-on time instant $t_{z0}$ for the zero vector such that the right-hand derivative of the stator current is zero at the time instant $t_{z0}$, i.e.

$$\lim_{t \to t_{z0}^+}\left(\frac{di_{sd}}{dt}\right) = \left(\frac{di_{sd}}{dt}\right)_{t=t_{z0}^+} = 0.$$

Then, immediately after the turn-on instant of the zero vector, the following equation (21) holds:

$$\left(\frac{di_{sd}}{dt}\right)_{t=t_{z0}^+} = \frac{1}{\sigma L_s}\left(\frac{\psi_R(t_{z0})}{\tau_r} - u_{th} - (R_s + R_R)i_{sd0}\right) = 0. \quad (21)$$

Since the rotor flux does not practically change when the current drops from $i_{dc\_magn}$ to $i_{sd0}$, the following approximation holds:

$$\psi_R(t_{z0}) \approx L_M i_{dc\_magn} = \tau_r R_R i_{dc\_magn} \qquad (22)$$

By inserting equation (22) into equation (21), the following is obtained $$R_R i_{dc\_magn} - u_{th} - (R_s + R_R)i_{sd0} = 0 \qquad (23)$$

In other words, the magnitude of the current limit $i_{sd0}$ which produces a zero derivative of the current at the time instant $t_{z0}$ is $$i_{sd0} = \frac{R_R i_{dc\_magn} - u_{th}}{R_s + R_R}. \qquad (24)$$

Figure 5:
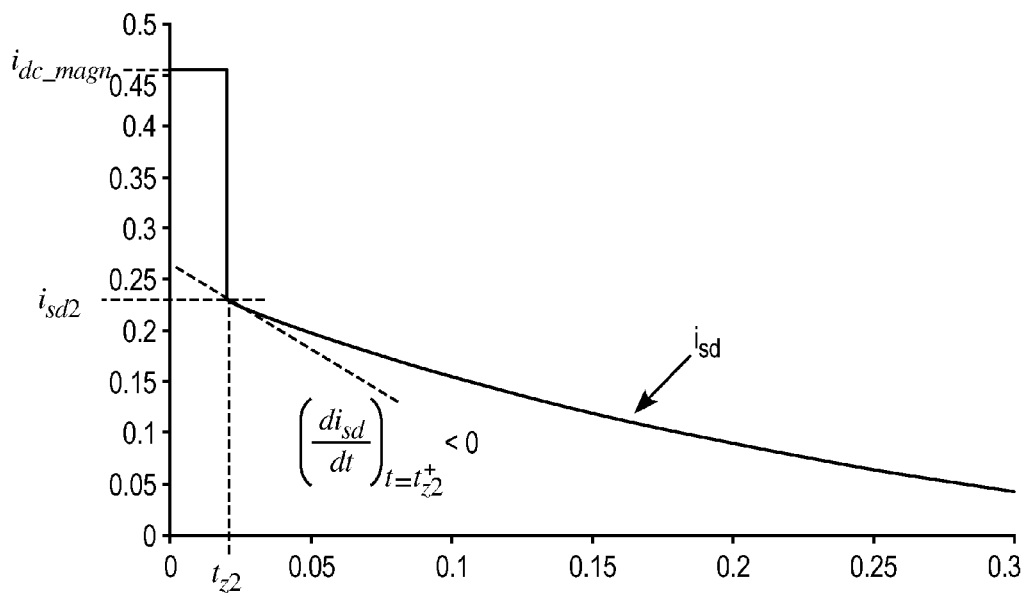

If the current falls below this limit prior to activating of the zero vector, the derivative corresponding to equation (21) is positive like in FIG. 4, where $t=t_{z1}$. If the zero voltage vector is activated again as in FIG. 5, i.e. too early, the current at the switching instant is $i_{sd2} > i_{sd0}$ and the derivative of the current is negative.

Figure 6:
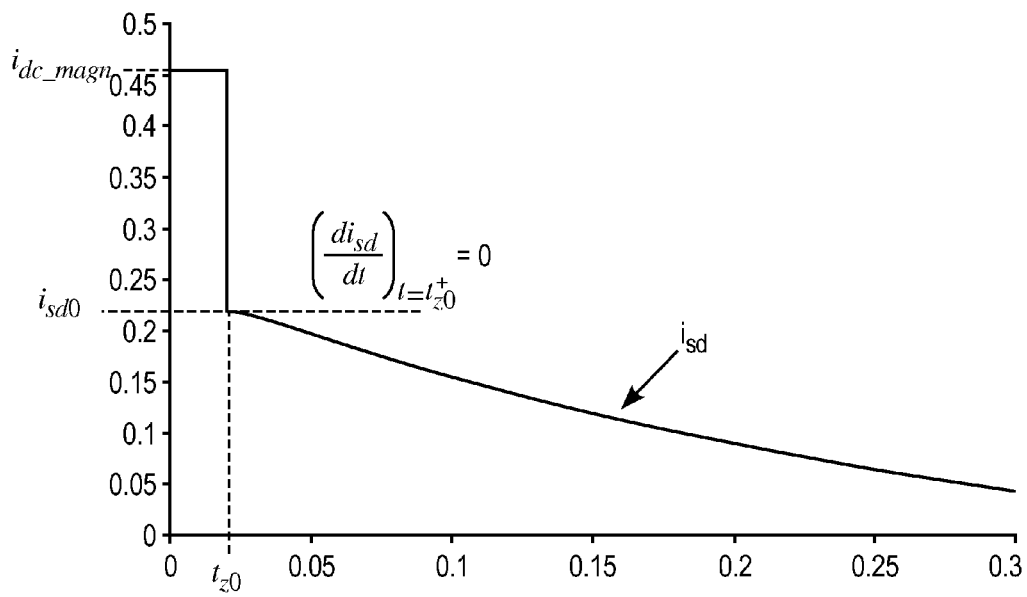

If the zero voltage vector is switched on at the time instant $t_{z0}$, where the current has dropped exactly to a value given by equation (24), the derivative of the stator current at the switching instant is zero, and the current waveform is in accordance with FIG. 6.

The aim is thus to find a current limit $i_{sd0}$ which produces the current waveform of FIG. 6. Practically, multiple current tests may be carried out to find the correct current value. Between the tests, the zero vector switching instant can be varied. Alternatively, the zero vector may be taken into use when the stator current drops to a set limit. This limit may also be varied for obtaining the correct current value, the derivative of which is zero at the turn-on instant.

Instead of passivating the power stage after the magnetization, the power stage can also be forced to produce a voltage vector with an opposing direction to that used during the DC magnetization, if the switching-on time instant of the zero voltage vector can be set more precisely.

Figure 7:
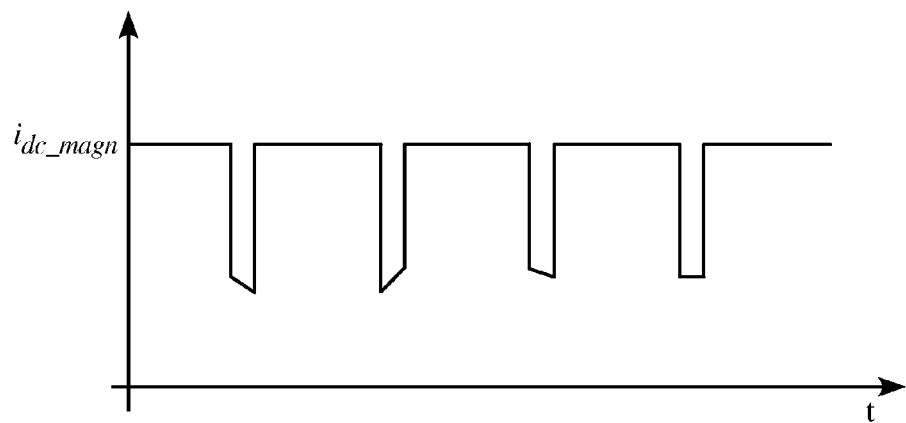
FIG. 7 shows a waveform of magnetizing current in accordance with an exemplary embodiment of the present disclosure.

The limit value for the current producing zero derivative at the switching-on time instant can be searched relatively fast. The magnetization of the machine for the next test can be started immediately after the current derivative at the beginning of the zero vector is calculated. The magnetization times between the tests are also quite short since the rotor flux does not decay much during the zero vectors. An exemplary stator current waveform during the search of the zero derivative is shown in FIG. 7.

Alternatively, the current limit $i_{sd0}$ can be approximated from two current responses giving a positive derivative and negative derivative. If these current responses are similar to those shown in FIGS. 4 and 5, the approximation of the current limit can be calculated from current limits $i_{sd1}$ and $i_{sd2}$ by weighting them in proportion to the derivatives, for example in the following way:

$$i_{sd0} \approx \frac{i_{sd2}\left|\left(\frac{di_{sd}}{dt}\right)_{t=t_{z1}^+}\right| + i_{sd1}\left|\left(\frac{di_{sd}}{dt}\right)_{t=t_{z2}^+}\right|}{\left|\left(\frac{di_{sd}}{dt}\right)_{t=t_{z1}^+}\right| + \left|\left(\frac{di_{sd}}{dt}\right)_{t=t_{z2}^+}\right|}. \qquad (25)$$

When the optimum current response and the related current limit $i_{sd0}$ are found, the rotor resistance estimate can be calculated using the current limit from equation (23), giving:

$$R_R = \frac{u_{th} + R_s i_{sd0}}{i_{dc\_magn} - i_{sd0}} \qquad (26)$$

The calculation of rotor resistance involves determining the threshold voltage $u_{th}$ and the stator resistance $R_s$. An issue with equation (26) is that the value of the threshold voltage is not necessarily known accurately. Further, the value of the threshold voltage affects the accuracy of the estimate obtainable with equation (26) greatly. If, however, the threshold voltage is known, equation (26) can be used directly.

In frequency converters, the threshold voltage can be a parameter that is set to a constant value or estimated during DC magnetization. If the threshold voltage is estimated, the commutation delays in the power stage make the threshold voltage estimate less accurate and thus the estimate of rotor resistance if the threshold voltage $u_{th}$ obtained from DC magnetization is placed to equation (26).

Equation (23) can, however, be used for obtaining a more accurate value for the threshold voltage (or for eliminating the threshold voltage). In a situation where the equation (23) holds, a zero vector is activated, current is even and it flows via the power components whose threshold voltage should be known in the above equations.

The concept behind this estimation is to carry out multiple zero vector tests described above with differing DC magnetization currents before passivating the power stage and by searching for different magnetizing currents $i_{dc\_magn,i}$ respective current limits $i_{sd0,i}$ which produce a zero derivative of the current at the instant of switching-on of the zero vector. Equation (23) holds then regardless of the magnitude of the used magnetizing current.

For example, by using two different magnetizing currents we obtain a pair of equations:

$$\begin{cases} R_R i_{dc\_magn,1} = u_{th} + (R_s + R_R) i_{sd0,1} \\ R_R i_{dc\_magn,2} = u_{th} + (R_s + R_R) i_{sd0,2} \end{cases} \qquad (27)$$

and by eliminating the threshold voltage $u_{th}$, the rotor resistance can be calculated as a function of stator resistance:

$$R_R = \frac{i_{sd0,1} - i_{sd0,2}}{(i_{dc\_magn,1} - i_{dc\_magn,2}) - (i_{sd0,1} - i_{sd0,2})} R_s \qquad (28)$$

The threshold voltage can also be solved from the pair of equations (27), giving:

$$u_{th} = \frac{(i_{dc\_magn,1} - i_{sd0,1})i_{sd0,2} - (i_{dc\_magn,2} - i_{sd0,2})i_{sd0,1}}{(i_{dc\_magn,2} - i_{sd0,2}) - (i_{dc\_magn,1} - i_{sd0,1})} R_s \qquad (29)$$

Correspondingly, by using multiple different DC magnetizing currents, we end in a group of equations $$\begin{cases} i_{dc\_magn,1} = A + Bi_{sd0,1} \\ i_{dc\_magn,2} = A + Bi_{sd0,2} \\ \ldots \\ i_{dc\_magn,n} = A + Bi_{sd0,n} \end{cases} \quad (30)$$

By using linear regression, the regression coefficients proportional to the threshold voltage and to the resistance ratio can be calculated $$\begin{cases} A \approx \dfrac{u_{th}}{R_R} \\ B \approx \dfrac{R_s + R_R}{R_R} \end{cases} \quad (31)$$

and further, the rotor resistance estimate and threshold voltage estimate can be calculated as a function of stator resistance.

$$\begin{cases} R_R = \dfrac{R_s}{(B-1)} \\ u_{th} = \dfrac{AR_s}{(B-1)} \end{cases} \quad (32)$$

Since the measurements are carried out with multiple measurement points, the estimates obtained with (32) are basically more accurate than the ones obtained with equations (28) and (29).

The estimated threshold voltage and rotor resistance can be identified separately, and these estimates need not be used in the embodiment given above.

Parameter-Independent Rotor Time Constant

In the above-described exemplary embodiments of estimating the rotor time constant, the sum of stator and rotor resistances was assumed to be known (equations (11), (15), (18) and (19)). Further, equations (11) and (15) involve using the rotor resistance as a separate parameter. When rotor resistance and threshold voltage estimates obtained with the above-described exemplary embodiments of the disclosure or in some other way are placed to the above-mentioned equations, the stator resistance is still an unknown parameter. Stator resistance can be easily measured during DC magnetization as a ratio between voltage and current. However, the stator resistance measured in this way can have an uncertainty since the average output voltage of a frequency converter is determined from the DC voltage of the intermediate circuit and from the output switch combination.

Due to commutation delays and uncertainties of compensation of the threshold voltages of the power stage, the output voltage of the frequency converter may be slightly inaccurate. This inaccuracy can have an impact during the DC magnetization since the voltage fed to the machine is small. This can be seen as an error in the stator resistance identified during the DC magnetization, and further in the rotor time constant if it is calculated based on the stator resistance.

Figure 8:
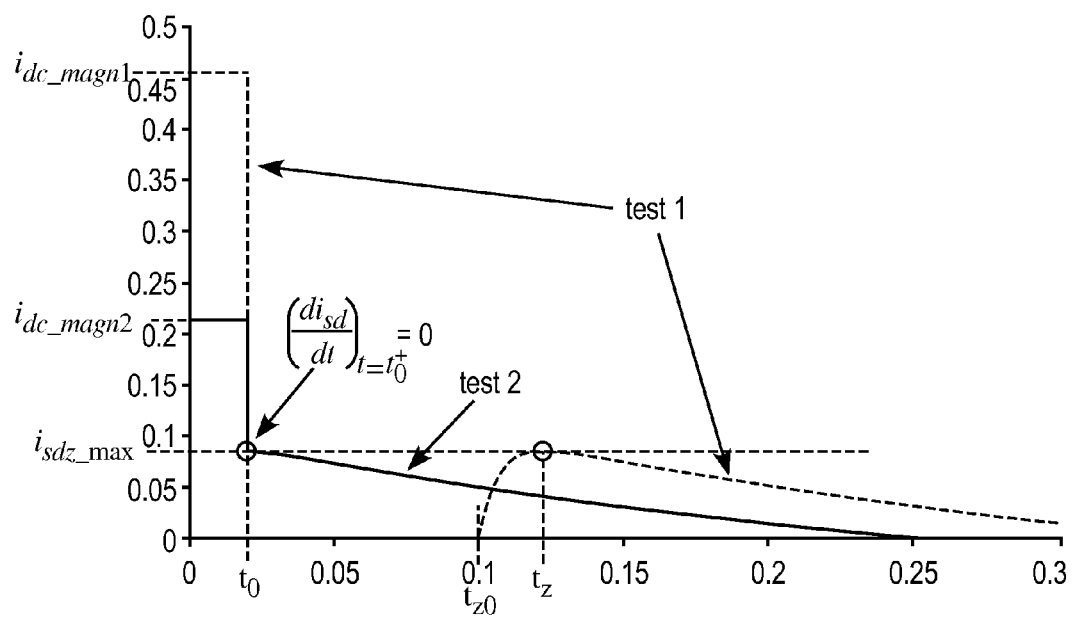
FIG. 8 shows stator current waveforms in accordance with another exemplary embodiment of the present disclosure.

The rotor time constant can be calculated almost independently of any parameters, when above-mentioned embodiments of estimating the rotor time constant, the rotor resistance and the threshold voltage are combined. In accordance with an exemplary embodiment of the present disclosure, two separate zero vector tests are carried out. In the first test (FIG. 8, test 1), the machine is magnetized with a current $i_{dc\_magn1}$ until a steady state is obtained. The pulses are then removed at a time instant $t_0$, and a zero vector is started at a time instant $t_{z0}$. Due to the zero vector, the current starts to increase and reaches a local maximum $i_{sdz\_max}$ at a time instant $t_z$.

After the first test, a second phase of the embodiment is carried out. In the second phase (test 2), a similar zero vector test is carried out as in connection with the embodiment used for determining the rotor time constant and threshold voltage. In this case, the machine is magnetized using DC current $i_{dc\_magn2}$, after which the pulses are removed (the power stage is passivated) at the time instant $t_0$. When the current has dropped to the level of the local maximum $i_{sdz\_max}$ obtained in test 1, a zero vector is activated. The purpose of test 2 is to find a magnetizing current $i_{dc\_magn2}$ that causes the current response to have a zero derivative when machine is magnetized with the mentioned current, and the zero vector is activated when the current is at the level of the mentioned local maximum.

The suitable magnetizing current can be obtained by using the above-described method for finding the zero derivative (FIGS. 4 to 7) such that $i_{ds0}$ is replaced by $i_{sdz\_max}$. In this case, however, the magnetizing current is changed instead of the current limit $i_{sd0}$. For example, in the case of FIG. 4, the magnetizing current should be reduced, and in the case of FIG. 5 the magnetizing current should be increased.

When the magnetizing current producing the zero derivative of the stator current has been found, according to equation (23)

$$R_R i_{dc\_magn2} = u_{th} + (R_s + R_R)i_{sdz\_max} \quad (33)$$

When equation (33) is inserted into equation (11) (such that $i_{dc\_magn}$ is substituted with $i_{dc\_magn1}$) we obtain an estimate for the rotor time constant:

$$\Rightarrow \tau_r = \dfrac{t_z - t_0}{\ln\left(\dfrac{i_{dc\_magn1}}{i_{dc\_magn2}}\right)}. \quad (34)$$

Accordingly, in the formula according to equation (34), no motor parameters need to be known. The formula contains a small error, since, like equation (11), equation (34) does not take into account the increase of stator current in the decaying of the rotor flux during time period $t_{z0} \ldots t_z$. This error depends on the motor parameters and, in this sense, equation (34) is not completely independent of the parameters of the machine.

A more accurate estimate, which takes into account the increase of stator current during period $t_{z0} \ldots t_z$, was introduced in equation (15). The same equation can also be used in connection with the present embodiment. When equation (33) is inserted into equation (15), we obtain:

$$\Rightarrow \tau_r = \dfrac{t_{z0} - t_0}{\ln\left(\dfrac{\tau_r i_{dc\_magn1}}{i_{dc\_magn2}(\tau_r + t_z - t_{z0}) - \int_{t_{z0}}^{t_z} i_{sd}(t)dt}\right)} \quad (35)$$

Like equation (34), equation (35) does not require any machine parameters. By using equation (35), a more accurate estimate of the rotor time constant can be obtained. On the other hand, a problem relating to equation (35) is that the rotor time constant is present in implicit form and to solve it requires iteration. The equation is, however, easily solved with an iteration algorithm by inserting the previously calculated estimate into the logarithmic function on the right-hand side of the equation. The iteration converges quite rapidly since the right-hand side of the equation is not heavily dependent on the rotor time constant used in the arguments of the logarithmic function.

In theory, the estimate produced by equation (35) is independent of other machine parameters if the L-equivalent circuit represents the dynamics of the machine accurately. In practice, the effect of iron losses on the derivative of current at the time instant $t_0$ is considerable, and thus, the magnetizing current $i_{dc\_magn2}$ giving the zero derivative can be something else than what it should be when it is calculated using the parameters of the L-equivalent circuit.

Figure 9:
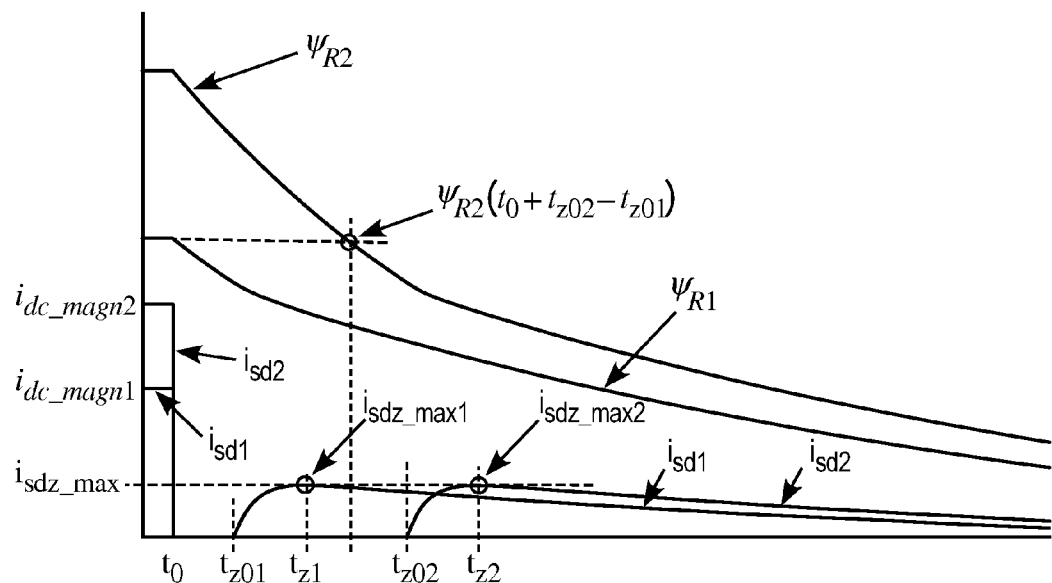
FIG. 9 shows stator current waveforms and rotor flux waveforms in accordance with an exemplary embodiment of the present disclosure.

For this reason, it is advisable to carry out two zero vector tests, prior to which the pulses are passivated for a certain period of time such that current is always zero when the zero vectors are activated, as indicated in FIG. 9. These tests are basically similar to the ones in FIG. 3. However, in this case, two different magnetizing currents, $i_{dc\_magn1}$ and $i_{dc\_magn2}$, can be used in such a way that the maximum values of the stator currents during the zero vectors are equal in magnitude. In other words, in FIG. 9 $i_{sdz\_max1} = i_{sdz\_max2} = i_{sdz\_max}$. Since in the situation of FIG. 9 $t_{z02} > t_{z01}$, in test 2 the magnetizing current $i_{dc\_magn2}$ has to be higher than the magnetizing current $i_{dc\_magn1}$ so that the decaying of the rotor flux during time interval $t_{z01} \ldots t_{z02}$ would be compensated.

By assuming that the rotor flux decays according to the same exponential law from time instant $t_0$ to instants $t_{z1}$ and $t_{z2}$, based on equation (12), we obtain $$\begin{cases} L_M i_{dc\_magn1} e^{-(t_{z1}-t_0)/\tau_r} = (u_{th} + (R_s + R_R)i_{sdz\_max})\tau_r - R_R \int_{t_{z01}}^{t_{z1}} i_{sd1}(t)dt \\ L_M i_{dc\_magn2} e^{-(t_{z2}-t_0)/\tau_r} = (u_{th} + (R_s + R_R)i_{sdz\_max})\tau_r - R_R \int_{t_{z02}}^{t_{z2}} i_{sd2}(t)dt \end{cases} \quad (36)$$

The current pulses during the zero vectors are identical, and thus $$\int_{t_{z01}}^{t_{z1}} i_{sd1}(t)dt = \int_{t_{z02}}^{t_{z2}} i_{sd2}(t)dt$$

The right-hand sides of the equation pair (36) have the same magnitude, and we obtain $$L_M i_{dc\_magn1} e^{-(t_{z1}-t_0)/\tau_r} = L_M i_{dc\_magn2} e^{-(t_{z2}-t_0)/\tau_r} \quad (37)$$

If the main inductance is not saturated when the magnetizing current increases from $i_{dc\_magn1}$ to $i_{dc\_magn2}$, it will be reduced from equation (37), leaving the rotor time constant as the only unknown.

From equation (37), the rotor time constant can be solved as follows:

$$i_{dc\_magn1} e^{-(t_{z1}-t_0)/\tau_r} = i_{dc\_magn2} e^{-(t_{z2}-t_0)/\tau_r} \quad (38)$$

$$\Leftrightarrow e^{(t_{z2}-t_{z1})/\tau_r} = \frac{i_{dc\_magn2}}{i_{dc\_magn1}}$$

$$\Leftrightarrow \tau_r = \frac{t_{z2} - t_{z1}}{\ln\left(\frac{i_{dc\_magn2}}{i_{dc\_magn1}}\right)}$$

Thus, in accordance with an exemplary embodiment, the machine is first magnetized with a magnetizing current $i_{dc\_magn1}$. After the magnetization, the switches of the inverter are controlled to a non-conductive state at the time instant $t_0$. At the time instant $t_{z01}$, the inverter is controlled to produce a zero vector and the stator current starts to rise. At the time instant $t_{z1}$, the stator current reaches its maximum value $i_{sdz\_max1}$ and starts to decay.

The machine is magnetized again using a different magnetization current $i_{dc\_magn2}$ and a similar procedure is repeated. The intention is to find a magnetizing current and a corresponding time instant when the zero vector is taken into use, which produce a stator current having a maximum value which corresponds to that obtained in the first phase of the test.

It is possible that the desired magnetizing current has to be searched by repeating the second phase of the test. The maximum value of the stator current during the zero vector can be changed by varying the magnitude of the magnetizing current or the time instant when the zero vector is taken into use. In FIG. 9, it is shown that the second magnetizing current $i_{dc\_magn2}$ is higher than the first $i_{dc\_magn1}$. However, the operation of the embodiment does not require that the lower current is used first. The only requirement for the currents is that the currents have different magnitudes.

Once the second magnetizing current and the time instant of the maximum value of the stator current during the zero vector have been found, the rotor time constant can be calculated using equation (38), in which the magnitude of the magnetizing current of the first magnetization and the time instant of the maximum value of the stator current during the first phase are used.

Since the current pulses during the zero vectors are identical, $$t_{z1} - t_{z01} = t_{z2} - t_{z02}$$

holds. Thus, in equation (38), the time difference $t_{z02} - t_{z01}$ can be used instead of the time difference $t_{z2} - t_{z1}$ resulting in $$\tau_r = \frac{t_{z02} - t_{z01}}{\ln\left(\frac{i_{dc\_magn2}}{i_{dc\_magn1}}\right)}. \quad (39)$$

Since the time difference between the turn-on instants of the zero vectors can be determined more accurately than the time difference between the maximum currents, the estimate of the rotor time constant from equation (39) gives more accurate results than equation (38).

Equation (39) can also be reached in a more straightforward manner by concluding that the rotor flux $\psi_{R2}$ in the last test at the time instant $t_0 + t_{z02} - t_{z01}$ must be equal to rotor flux $\psi_{R1}$ at the time instant $t_0$ in the first test. This is due to the zero vectors being switched on after an equal time period ($=t_{z01}$) has expired after these instants, and they produce current pulses with exactly the same magnitude.

Thus, it can be concluded that the following holds and leads directly to equation (39)

$$\psi_{R1}(t_0) = \psi_{R2}(t_0 + t_{z02} - t_{z01}) = \psi_{R2}(t_0) e^{-(t_{z02}-t_{z01})/\tau_r}$$

$$\Leftrightarrow L_M i_{dc\_magn1} = L_M i_{dc\_magn2} e^{-(t_{z02}-t_{z01})/\tau_r} \quad (40)$$

⇒ equation (39).

Main Inductance

The main inductance $L_M$ can be calculated from the estimates obtained with the embodiments of the present disclosure as a product of rotor time constant and rotor resistance, i.e.

$$L_M = R_R \tau_r \quad (41)$$

The main inductance calculated with equation (41) is accurate since the rotor time constant and the rotor resistance estimated with the method of the disclosure are also accurate.

Control System

Figure 10:
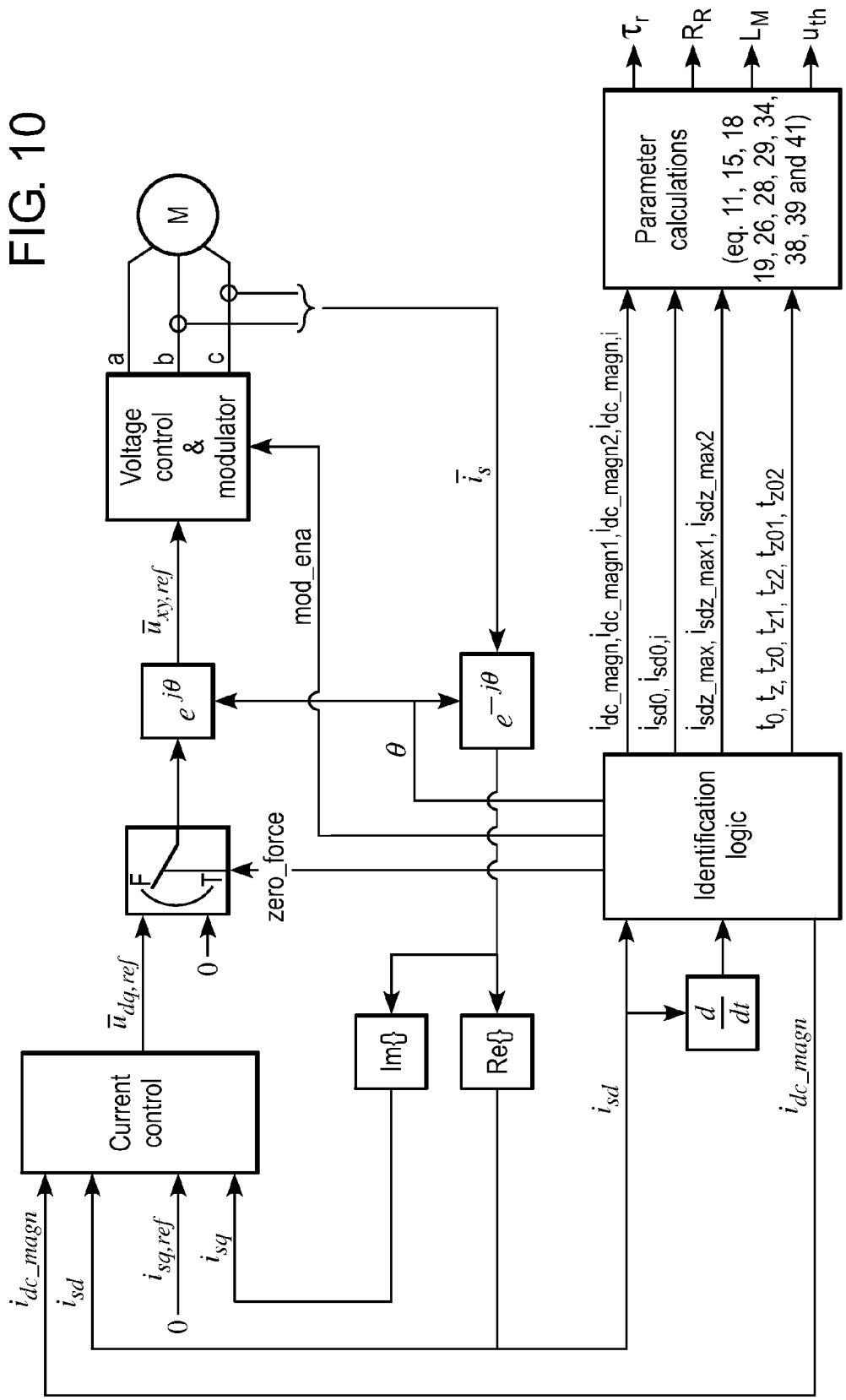
FIG. 10 shows an example of a control system for carrying out embodiments of the present disclosure.

FIG. 10 shows an example of a control system that is usable to carry out features of the above-described method of the disclosure. The control system is used during normal operation of a frequency converter for controlling the machine in a desired manner. The control system produces control signals to the power stage of the frequency converter. The control signals are calculated in a modulator of the frequency converter according to a modulation scheme with which the machine is controlled. According to an exemplary embodiment, the control system includes a processor (e.g., a computer processor) configured to execute computer-readable instructions (e.g., a computer program) recorded (e.g., encoded) on a non-volatile memory such as a ROM, hard disk drive, optical memory, flash memory, etc. The processor of the control system can be comprised in the frequency converter and/or be communicatively connected to the frequency converter. The features of the control system are illustrated in FIG. 10 with respect to functional processing blocks achieved by the processor executing the computer-readable instructions to carry out the above-described exemplary method. Accordingly, as used herein, the control system includes means for performing the operative functions of the above-described exemplary embodiment.

In FIG. 10, the control system contains a current controller, a voltage controller and a modulator operating in a dq-coordinate system. During DC magnetization, the voltage reference is outputted by the current controller, which controls the d-component of the current according to the reference for the magnetizing current $i_{dc\_magn}$ and, correspondingly, controls the q-component of the current to zero. With these control actions, the current vector is forced in the direction of an angle θ, which gives the direction of the magnetization and thus the direction of the d-axis. The voltage reference is transformed into the stator reference frame and fed to the voltage controller and further to the modulator controlling the power stage. The induction machine connected to the frequency converter produces a current response, which is transformed into the dq-coordinate system on the basis of the measured phase currents and the direction of the magnetization theta. According to an exemplary embodiment, the angle θ is selected to be in the direction of a phase of the induction machine, but, it can also be selected arbitrarily.

The control system can be used in connection with determining the rotor time constant described above in the following way. At the time instant $t=t_0$ (see FIG. 2), the identification block passivates the power stage of the frequency converter by setting parameter mod_ena to False, which sets the output switch components to an off-state and phase currents to zero when the terminal voltage of the machine sets to the voltage induced by the decaying rotor flux. At the time instant $t=t_{z0}$, the identification block activates the power stage and forces a zero voltage vector to use by setting both parameters mod_ena and zero_force to True. During the zero voltage vector, the identification block determines the maximum value of current $i_{sd}$ ($i_{sdz\_max}$) and its time instant $t_z$ for determining the rotor time constant according to equation (11).

The other embodiments of the disclosure can be carried out similarly with the control system of FIG. 10 by sequentially controlling the enable signals zero_force and mod_ena. The signal zero_force forces the zero vector to be taken into use (time instants $t_{z0}$, $t_{z01}$ and $t_{z02}$) and the signal mod_ena passivates the power stage (time instant $t_0$). In the example of FIG. 10, the zero vector is commanded by giving a voltage reference to the modulator. The zero vector can alternatively be taken into use by controlling the output switch components directly without using the voltage reference illustrated in FIG. 10.

Different embodiments of the present disclosure may require a different number of DC magnetizations, power stage passivations and zero vector forcings, as was described above in detail in connection with the different embodiments. An identification logic block in FIG. 10 takes care of the various signals controlling the procedures of exemplary embodiments of the present disclosure and also monitors the magnitude of the stator current and its derivative for obtaining values for $i_{sdz\_max}$, $i_{sdz\_max1}$, $i_{sdz\_max2}$, $i_{sd0}$, $t_z$, $t_{z1}$ and $t_{z2}$. These values are signalled to a parameter calculation block, which uses various equations for calculating the required parameters as described above in detail.

The above control system indicates that all above described parameters are calculated. However, some of the parameters need not be estimated using the method of the disclosure and some of the parameters may be estimated using other methods.

It will be obvious to a person skilled in the art that, as the technology advances, the inventive concept can be implemented in various ways. The disclosure and its embodiments are not limited to the examples described above but may vary within the scope of the claims.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A method of identifying parameters of an induction machine when the induction machine is connected to the output phases of a voltage source inverter and the induction machine is in standstill state, the method comprising:
    providing a DC magnetization current ($i_{dc\_magn}$) to the induction machine with the inverter;
    controlling power semiconductors of the inverter to an off-state;
    controlling all output phases of the inverter to the same potential to provide a zero voltage vector;
    measuring a stator current ($i_{sd}$) during the zero voltage vector; and
    determining, in a processing device, parameters of the induction machine from the stator current ($i_{sd}$) measured during the zero voltage vector.

2. The method according to claim 1, wherein the identified parameter is a rotor time constant ($\tau_r$), and wherein
    the measuring of the stator current ($i_{sd}$) comprises measuring a maximum current ($i_{sdz\_max}$) during the zero voltage vector and its time instant ($t_z$), and
    determining the rotor time constant ($\tau_r$) from
        the magnitude of the DC magnetization current ($i_{dc\_magn}$),
        stator and rotor resistances ($R_s$, $R_R$) of the machine,
        the determined maximum current ($i_{sdz\_max}$) and its time instant ($t_z$),
        the time instant ($t_0$) when the power semiconductors are controlled to an off-state, and
        from the threshold voltage of the inverter ($u_{th}$).

3. The method according to claim 1, wherein the identified parameter is a rotor time constant ($\tau_r$), and wherein the measuring of the stator current comprises measuring the maximum current ($i_{sdz\_max}$) during the zero voltage vector and its time instant ($t_z$), and determining the rotor time constant numerically using an iteration algorithm from
the magnitude of the DC magnetization current ($i_{dc\_magn}$),
stator and rotor resistances ($R_s$, $R_R$) of the machine,
the determined maximum current ($i_{sdz\_max}$) and its time instant ($t_z$),
the time instant ($t_{z0}$) when the zero vector is taken into use,
the time instant ($t_0$) when the power semiconductors are controlled to off-state,
the threshold voltage ($u_{th}$) of the inverter, and
from an initial estimate of the rotor time constant.

4. The method according to claim 1, wherein the identified parameter is a rotor time constant ($\tau_r$), and wherein
the measurement of the stator current comprises measuring the maximum ($i_{sdz\_max}$) current and its time instant ($t_z$),
the measurement of the maximum current is repeated using the same magnetization current ($i_{dc\_magn}$) with different turn-on instants ($t_{z01}$, $t_{z02}$) for the zero voltage vector,
determining the rotor time constant from
the measured time instants ($t_{z1}$, $t_{z2}$) of the maximum currents,
the measured maximum currents ($i_{sdz\_max1}$, $i_{sdz\_max2}$),
stator and rotor resistances ($R_s$, $R_R$) of the machine, and
the threshold voltage ($u_{th}$) of the inverter.

5. The method according to claim 1, wherein the identified parameter is a rotor time constant ($\tau_r$), wherein
the measurement of the stator current comprises measuring the maximum current ($i_{sdz\_max}$),
the measurement of the maximum current is repeated using the same magnetization current ($i_{dc\_magn}$) with different turn-on instants ($t_{z01}$, $t_{z02}$) for the zero voltage vector, and
determining the rotor time constant from
the turn-on time instants ($t_{z01}$, $t_{z02}$) for zero voltage vectors,
the measured maximum currents ($i_{sdz\_max1}$, $i_{sdz\_max2}$),
stator and rotor resistances ($R_s$, $R_R$) and
the threshold voltage ($u_{th}$) of the inverter.

6. The method according to claim 1, wherein the identified parameter is rotor resistance ($R_R$) of the machine, wherein
the controlling of the output phases of the inverter to the same potential comprises controlling the output phases to the same potential such that the derivative of the stator current ($i_{sd}$) immediately after the switching is zero, and
the measuring of the stator current ($i_{sd}$) comprises measuring the stator current is immediately after the switching,
wherein the rotor resistance ($R_R$) is calculated from
the measured stator current ($i_{sd0}$),
the magnitude of the magnetization current ($i_{dc\_magn}$),
the threshold voltage ($u_{th}$) of the inverter, and
stator resistance ($R_s$) of the machine.

7. The method according to claim 1, wherein the identified parameter is rotor resistance ($R_R$) of the machine, wherein
the controlling of the output phases to the same potential comprises controlling the output phases to the same potential such that the derivative of the stator current ($i_{sd}$) immediately after the switching is zero,
the measuring of the stator current comprises measuring the stator current immediately after the switching, and
the steps are repeated with different magnetization currents ($i_{dc\_magn,1}$, $i_{dc\_magn,2}$, ($i_{dc\_magn,n}$) once or multiple of times for obtaining two or more stator current values ($i_{sd0,1}$, $i_{sd0,2}$, $i_{sd0,n}$) and magnitudes of magnetization currents ($i_{dc\_magn,1}$, $i_{dc\_magn,2}$, $i_{dc\_magn,n}$),
wherein the rotor resistance is calculated from
the measured stator currents ($i_{sd0,1}$, $i_{sd0,2}$, $i_{sd0,n}$),
the magnitudes of the magnetization currents ($i_{dc\_magn,1}$, $i_{dc\_magn,2}$, $i_{dc\_magn,n}$), and
stator resistance ($R_s$) of the machine.

8. The method according to claim 1, wherein the identified parameter is a threshold voltage ($u_{th}$) of the inverter, wherein
the controlling of the output phases to the same potential comprises controlling the output phases to the same potential such that the derivative of the stator current instantly after the switching is zero, and
the measuring the stator current comprises measuring the stator current instantly after the switching, and
wherein the threshold voltage of the inverter is calculated from
the measured stator current ($i_{sd0}$),
the magnitude of the magnetization current ($i_{dc\_magn}$),
rotor resistance ($R_R$) of the machine, and
stator resistance ($R_s$) of the machine.

9. The method according to claim 1, wherein the identified parameter is a threshold voltage ($u_{th}$) of the inverter, wherein
the controlling of the output phases to the same potential comprises controlling the output phases to the same potential such that the derivative of the stator current instantly after the switching is zero,
the measuring of the stator current comprises measuring the stator current instantly after the switching, and
the steps are repeated with different magnetization currents once or multiple times for obtaining two or more stator current values ($i_{sd0,1}$, $i_{sd0,2}$, $i_{sd0,n}$) and magnitudes of magnetization currents ($i_{dc\_magn,1}$, $i_{dc\_magn,2}$, $i_{dc\_magn,n}$), and
wherein the threshold voltage of the inverter is calculated from
the measured stator currents ($i_{sd0,1}$, $i_{sd0,2}$, $i_{sd0,n}$),
the magnitudes of the magnetization currents ($i_{dc\_magn,1}$, $i_{dc\_magn,2}$, $i_{dc\_magn,n}$), and
stator resistance ($R_s$) of the machine.

10. The method according to claim 1, wherein the identified parameter is a rotor time constant, wherein
the measuring comprises measuring the maximum current ($i_{sdz\_max}$) during the zero voltage vector and its time instant ($t_z$),
the method further comprises:
a) providing DC magnetization to the induction machine with a second magnetization current,
b) controlling the power semiconductors of the inverter to an off-state,
c) controlling all output phases of the inverter to the same potential to provide a zero voltage vector when the stator current has dropped to the value of the measured maximum current ($i_{sdz\_max}$), and determining the derivative of the stator current instantly after the controlling of the output switches,
changing the value of the second magnetizing current ($i_{dc\_magn,2}$) and repeating steps a), b) and c) if the determined derivative of the stator current is not zero, and
calculating the rotor time constant from
the time instant ($t_z$) of the maximum current ($i_{sdz\_max}$) of the stator current during the zero vector,
the time instant ($t_0$) when the power semiconductors are controlled to off-state,
the magnitude of the magnetizing current ($i_{dc\_magn,1}$) used in the magnetization that produced the measured maximum current ($i_{sdz\_max}$), and the magnitude of the second magnetizing current ($i_{dc\_magn,2}$) that produced the zero derivative of the stator current.

11. The method according to claim 1, wherein the identified parameter is a rotor time constant, wherein the measuring comprises measuring the maximum current ($i_{sdz\_max}$) during the zero voltage vector and its time instant ($t_z$), and the method further comprises a) providing DC magnetization to the induction machine with a second magnetization current, b) controlling the power semiconductors of the inverter to an off-state, c) controlling all output phases of the inverter to the same potential to provide a zero voltage vector when the stator current has dropped to the value of the measured maximum current, and determining the derivative of the stator current instantly after the controlling of the output switches, changing the value of the second magnetizing current ($i_{dc\_magn,2}$) and repeating steps a), b) and c) if the determined derivative of the stator current is not zero, and calculating the rotor time constant from the turn-on time instant ($t_{z0}$) when the zero voltage vector is activated, the time instant ($t_z$) of the maximum current of the stator current during the zero vector, the time instant ($t_0$) when the power semiconductors are controlled to off-state, the magnitude of the magnetizing current ($i_{dc\_magn,1}$) used in the magnetization that produced the measured maximum current ($i_{sdz\_max}$), the magnitude of the second magnetizing current ($i_{dc\_magn,2}$) that produced the zero derivative of the stator current, and an initial value of the rotor time constant.

12. The method according to claim 11, wherein the rotor time constant is calculated iteratively using the calculated rotor time constant as an initial value of the rotor time constant in the iteration.

13. The method according to claim 1, wherein after the magnetization, the power semiconductors are controlled to produce a voltage vector having an opposite polarity when compared to the voltage vector used in the magnetization.

14. The method according to claim 1, wherein the identified parameter is a rotor time constant, wherein the measuring comprises measuring the maximum current ($i_{sdz\_max}$) during the zero voltage vector and its time instant ($t_{z1}$), and the method further comprises a) providing DC magnetization to the induction machine with a second magnetization current ($i_{dc\_magn,2}$), b) controlling the power semiconductors of the inverter to an off-state, c) controlling all output phases of the inverter to the same potential to provide a zero voltage vector, and measuring the maximum value of the stator current during the zero voltage vector and its time instant ($t_{z2}$), changing the value of the second magnetizing current ($i_{dc\_magn,2}$) and repeating steps a), b) and c) if the maximum value of the stator current is not equal to the maximum current ($i_{sdz\_max}$) measured during the first magnetization, and calculating the rotor time constant from the time instant ($t_{z1}$, $t_{z2}$) of the maximum current ($i_{sdz\_max}$) of the stator current during the zero vectors, the magnitude of the magnetizing current ($i_{dc\_magn,1}$) used in the magnetization that produced the measured maximum current ($i_{sdz\_max}$), and the magnitude of the second magnetizing current ($i_{dc\_magn,2}$) that produced a stator current which had the maximum value equal to that of the first magnetization.

15. The method according to claim 14, wherein, in the calculation of the rotor time constant, the time instants ($t_{z01}$, $t_{z02}$) when the zero vectors were taken into use are used.

16. The method according to claim 14, wherein the time instant when the zero vector is taken into use is changed for obtaining a stator current having a maximum value equal to that of the maximum current measured during the first magnetization.

17. An arrangement for identifying parameters of an induction machine when the induction machine is connected to the output phases of a voltage source inverter and the induction machine is in standstill state, wherein the inverter is configured to provide DC magnetization to the induction machine, and the arrangement comprises:

means for controlling the power semiconductors of the inverter to an off-state;

means for controlling all output phases of the inverter to the same potential to provide a zero voltage vector;

means for measuring the stator current during the zero voltage vector; and means for determining parameters of the induction machine from the stator current measured during the zero voltage vector.

18. The method according to claim 12, wherein after the magnetization, the power semiconductors are controlled to produce a voltage vector having an opposite polarity when compared to the voltage vector used in the magnetization.

19. The method according to claim 15, wherein the time instant when the zero vector is taken into use is changed for obtaining a stator current having a maximum value equal to that of the maximum current measured during the first magnetization.

* * * * *